United States Patent [19]

Noddings et al.

[11] 4,314,165

[45] Feb. 2, 1982

[54] ELECTRICAL STORAGE CIRCUIT WITH TEMPERATURE INDEPENDENT FET OUTPUT

[75] Inventors: John Noddings, Ryton-on-Dunsmore; Roland K. Borton, Rugby, both of England

[73] Assignee: Associated Engineering Limited, England

[21] Appl. No.: 85,108

[22] Filed: Oct. 15, 1979

Related U.S. Application Data

[62] Division of Ser. No. 774,865, Mar. 7, 1977, Pat. No. 4,196,466.

[51] Int. Cl.$^3$ .............. H01L 31/00

[52] U.S. Cl. .............. 307/310; 307/264; 307/238.8; 307/571

[58] Field of Search .............. 307/353, 264, 251, 310

[56] References Cited

U.S. PATENT DOCUMENTS

| | | | |
|---|---|---|---|
| 3,753,132 | 8/1973 | Hill | 307/353 |
| 3,760,199 | 9/1973 | Graemet | 307/310 |
| 4,249,091 | 2/1981 | Yamagiwa | 307/310 |

*Primary Examiner*—Harold A. Dixon

*Attorney, Agent, or Firm*—Leydig, Voit, Osann, Mayer & Holt, Ltd.

[57] ABSTRACT

A system for controlling the speed of a motor vehicle comprises means deriving a first electrical signal having a mean level related to the actual speed of the vehicle and an alternating component whose amplitude is related to the actual speed of the vehicle, means storing a second electrical signal having a mean level related to a desired value for the vehicle speed and substantially free of any alternating component, means arranged to compare the first and second electrical signals whereby to produce an error signal having a mean level related to the difference, if any, between the actual and desired vehicle speeds and an alternating component related to the actual vehicle speed, and speed correcting means responsive to the amplitude of the error signal for correcting the actual speed of the vehicle. Adjusting means for attenuating the amplitude of the alternating component of the error signal at higher vehicle speeds is provided, together with tuning means for phase shifting the first electrical signal at a speed, speed range or rate of change of speed.

3 Claims, 16 Drawing Figures

ELECTRICAL STORAGE CIRCUIT WITH TEMPERATURE INDEPENDENT FET OUTPUT

This is a division of application Ser. No. 774,865, filed Mar. 7, 1977, now U.S. Pat. No. 4,196,466.

The invention relates to speed responsive systems and methods, and more particularly to speed responsive systems for engines and/or motor vehicles whereby the vehicle may be kept at or about a predetermined speed or limited to a predetermined speed, or the operator of the engine or vehicle may be warned when the predetermined speed has been reached.

According to the invention, there is provided a speed responsive system, comprising means arranged to produce a first electrical signal having a mean level related to the said speed and an alternating component whose amplitude is related to the said speed, and means connected to compare the first electrical signal with a second electrical signal having a mean level representative of a desired value or limit for the said speed and substantially free of an alternating component whereby to produce an error signal having a mean level related to a difference between the actual speed and the desired value or limit thereof and an alternating component having an amplitude related to the actual speed.

According to the invention, there is also provided a speed control system, comprising means arranged to produce a first electrical signal related to said speed, means connected to compare the first electrical signal with a second electrical signal representative of a desired value or limit for the said speed whereby to produce an error signal having a level related to a difference between the actual speed and the desired value or limit thereof, speed correcting means responsive to the amplitude of the error signal for adjusting the actual speed accordingly, whereby to reduce the said difference towards zero, and tuning means connected to receive the first electrical signal and to provide a phase shift thereto at a frequency or frequencies corresponding to a predetermined speed, speed range or rate of change of speed whereby to damp hunting of the system.

According to the invention, there is further provided a system for controlling the speed of a motor vehicle, comprising means arranged to derive a first electrical signal having a mean level related to the actual speed of the vehicle and an alternating component whose amplitude is related to the actual speed of the vehicle, means for storing a second electrical signal having a mean level related to a desired value for the vehicle speed and substantially free of any alternating component, means arranged to compare the first and second electrical signals whereby to produce an error signal having a mean level related to the difference, if any, between the actual vehicle speed and the desired value therefor and an alternating component related to the actual vehicle speed, speed correcting means responsive to the amplitude of the error signal for adjusting the actual speed of the vehicle in a direction tending to eliminate the difference between the actual and desired values of the vehicle speed, and adjusting means for varying the relationship between the amplitude of the alternating component of the error signal and the actual vehicle speed in a predetermined manner with respect to the vehicle speed.

According to the invention, there is yet further provided a system for controlling the speed of a motor vehicle, comprising means arranged to derive a first electrical signal having a mean level related to the actual speed of the vehicle and an alternating component whose amplitude is related to the actual speed of the vehicle, means for storing a second electrical signal having a mean level related to a desired value for the vehicle speed and substantially free of any alternating component, means arranged to compare the first and second electrical signals whereby to produce an error signal having a mean level related to the difference, if any, between the actual vehicle speed and the desired value therefor and an alternating component related to the actual vehicle speed, speed correcting means responsive to the amplitude of the error signal for adjusting the actual speed of the vehicle accordingly whereby to reduce the said difference towards zero, and tuning means operative to phaseshift the first electrical signal at a frequency or frequencies corresponding to a predetermined vehicle speed, speed range or rate of change of speed, whereby to tend to attenuate hunting.

According to the invention, there is still further provided a storage circuit for storing an electrical signal, comprising a capacitor connected to be charged by the electrical signal through an electronic switch capable of assuming a high impedance state to minimise subsequent discharge of the capacitor, a field effect transistor connected to have its conduction controlled by the charge on the capacitor, the output circuit of the field effect transistor being connected as part of a potential divider circuit which includes means for controlling the current therein to be substantially constant at a predetermined value and across part of which is derived an output signal of the storage circuit in dependence on the charge on the capacitor, the said predetermined value of current being such as to minimise the temperature dependence of the conductivity of the field effect transistor.

A speed-responsive system embodying the invention and for controlling a motor vehicle to run at a predetermined speed will now be described, by way of example only, with reference to the accompanying diagrammatic drawings in which.

Figure 2:
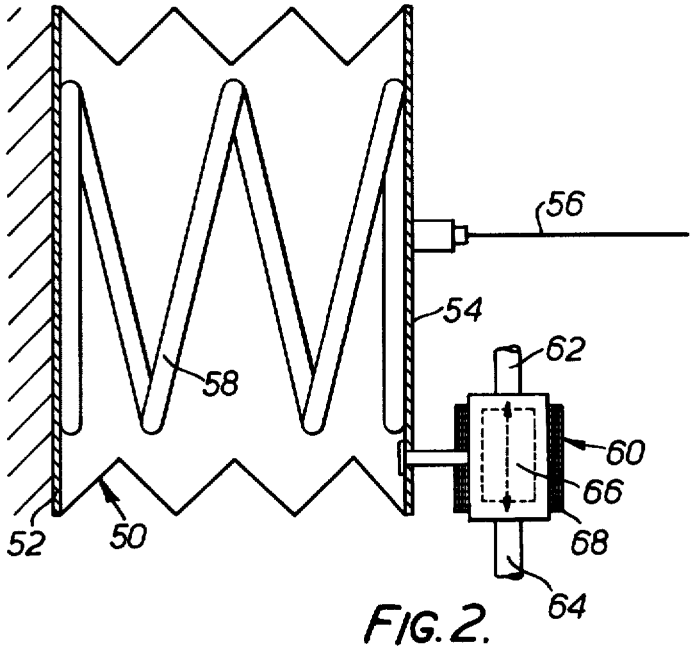
FIG. 2 is a section through a throttle actuator for the system.
Figure 7:
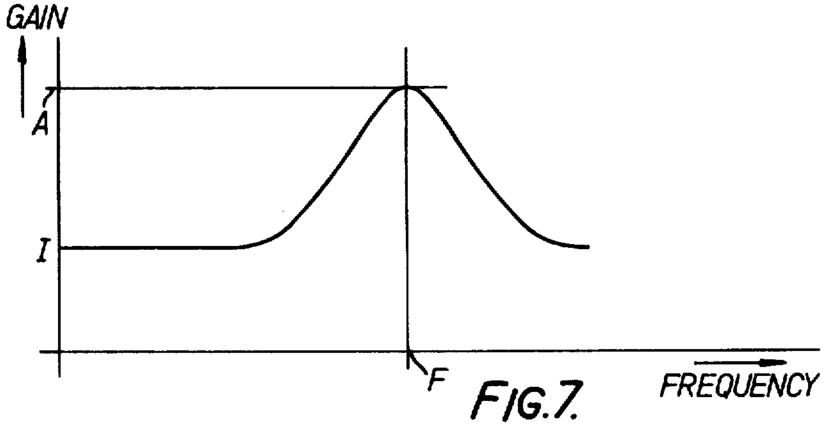
Figure 8:
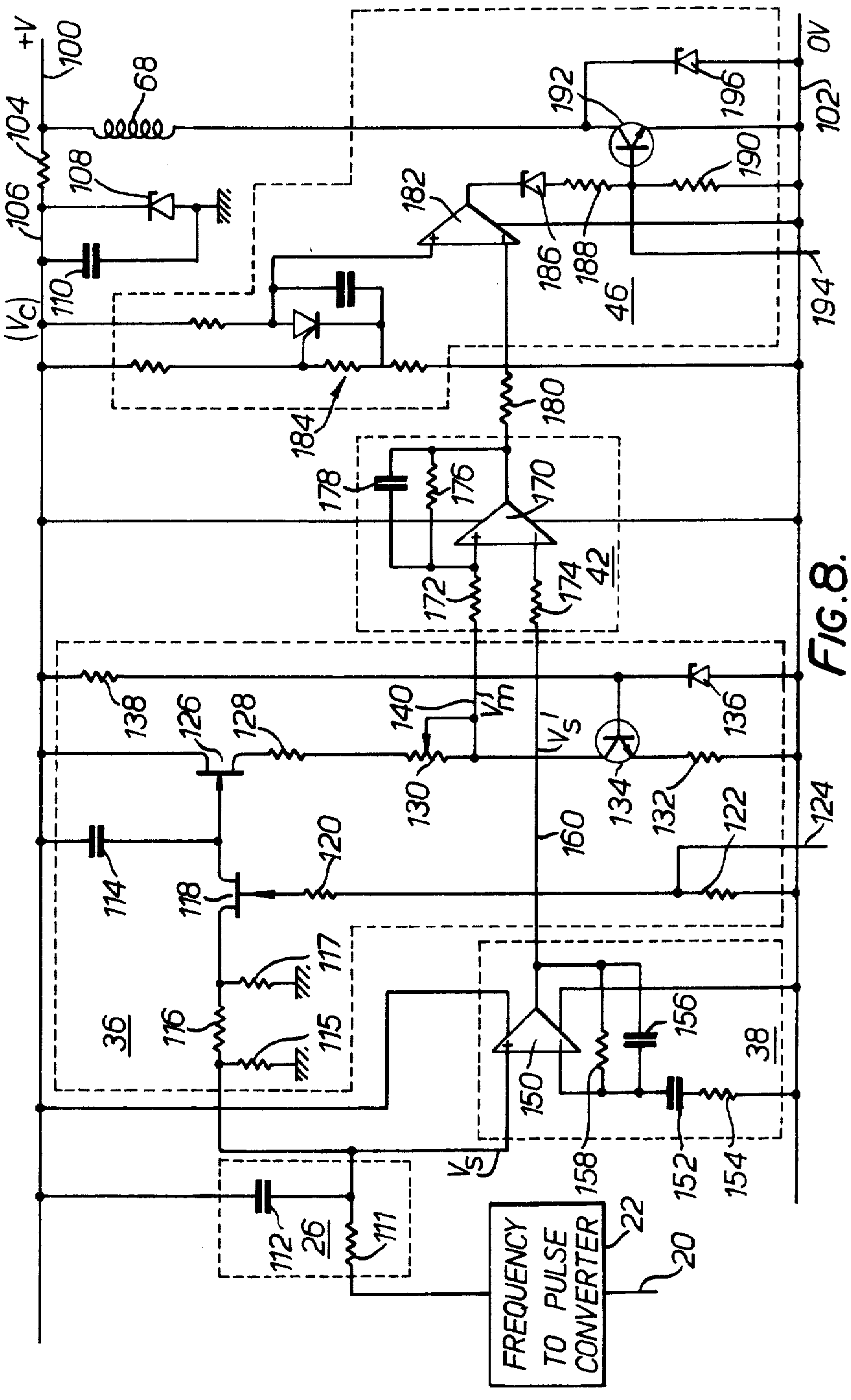

FIGS. 5A, 5B, and 6A to 6D show error signals produced by the system and explain how these are converted to drive pulses for controlling the speed actuator of FIG. 2;

FIG. 7 shows the gain/frequency characteristic of an active filter in the system; and FIG. 8 is a schematic circuit diagram of the system.

The system to be described is for automatically controlling a motor vehicle to run at a predetermined speed which is set by the driver. Once the speed has been selected and set by the driver, the system operates automatically to hold the vehicle at that speed (subject, of course, to the speed being within the capability of the vehicle having regard to the gradient and similar factors).

Figure 1:
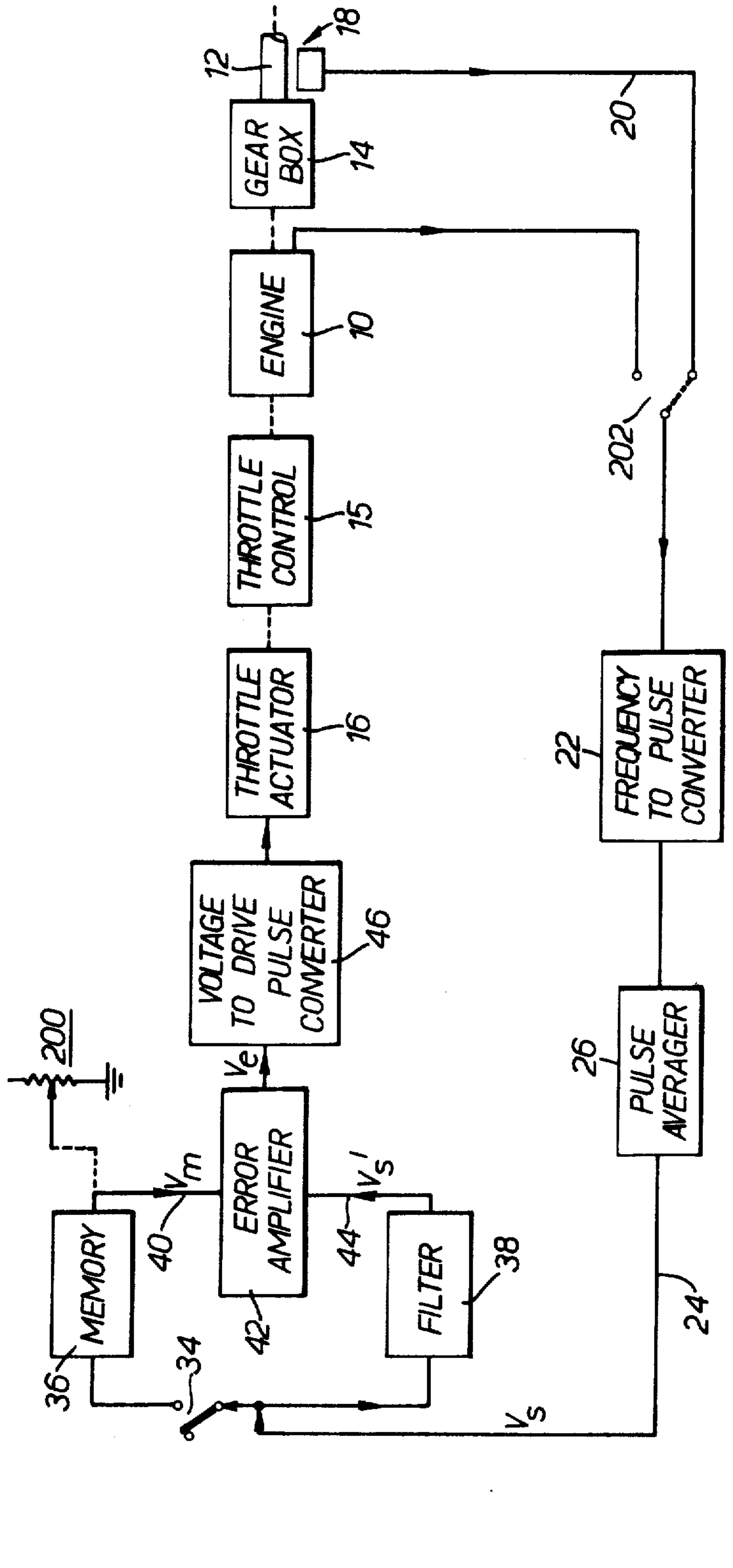
FIG. 1 is a block circuit diagram of the system.

FIG. 1 shows the engine 10 of the motor vehicle driving the propellor shaft 12 through a gear box 14, the speed of the engine being regulated by means of a throttle control 15. The control 15 would of course normally form part of the engine carburettor and is arranged to be adjustable by the driver's throttle pedal in the usual way. In addition, however, it is connected to be adjustable by means of a throttle actuator 16.

The road speed of the vehicle is monitored by a transducer 18 which is sensitive to the rotational speed of the propellor shaft 12. For example, the propellor shaft 12 may be fitted with one or more magnetic elements which rotate with the propellor shaft and produce an alternating electrical signal in a suitable magnetic pick-up. However, it will be appreciated that other types of transducer, such as operating on optical or mechanical principles, may be used instead. In each case, however, an electrical signal whose frequency is dependent on the vehicle speed is produced on a line 20 and fed to a frequency to pulse converting circuit 22.

The circuit 22 converts the electrical signal on line 20 into a train of constant-amplitude, constant-width pulse whose frequency is proportional to the vehicle speed.

The train of pulses is fed by a line 24 to a pulse averaging circuit 26. The pulse averaging circuit produces a unidirectional signal $V_s$ which is dependent on the average level of the pulse train on line 24—that is, dependent on the pulse frequency and thus on the vehicle speed. In addition, the pulse averager circuit 26 is arranged such that the signal $V_s$ carries a ripple frequency equal to the frequency of the pulses on the line 24.

Signal $V_s$ is fed into a memory 36, via a switch 34, and also into filter 38. In a manner to be described in more detail below, the memory 36 is arranged to store the mean amplitude of a particular value of $V_s$ corresponding to a desired vehicle speed, and a signal $V_m$ dependent on this mean amplitude is then output on a line 40 to an error amplifier 42.

The filter 38 processes the signal $V_s$ in a manner to be described in more detail below and produces an output signal $V_s'$ dependent on $V_s$, and $V_s'$ is fed to a second input of amplifier 42 on a line 44.

The error amplifier 42 detects and amplifies the difference between the signals $V_m$ and $V_s'$ and produces an error signal $V_e$ dependent on the difference as will be explained in more detail below.

The error signal $V_e$ is fed into a voltage to pulse converter 46 which converts $V_e$ into a train of drive pulses having a constant amplitude and a constant frequency but whose mark/space ratio varies in dependence on the amplitude of $V_e$. These drive pulses operate the throttle actuator 16.

The throttle actuator 16 may take any suitable form but one form is shown in the Complete Specification of our copending Cognate Patent Applications Nos. 23062/75 and 23063/75 and is illustrated in simplified form in FIG. 2.

As shown in FIG. 2, the throttle actuator 16 comprises a bellows 50 one end 52 of which is anchored to a fixed part of the vehicle body and the other end 54 of which moves with expansion and contraction of the bellows and is connected to the caraburettor throttle control 15 by means of cable 56. A compression spring 58 is mounted within the bellows and tends to hold the bellows in an expanded state, and in this state no tension is applied to the cable 56 and the vehicle throttle is controllable by the driver's throttle pedal in the normal way.

The interior of the bellows 50 is connected to a two-way valve 60. The valve has a port 62 connected to atmospheric pressure and another port 64 connected to the engine manifold. A valve member 66 can be moved to and fro in the direction of the arrows shown by means of a solenoid coil 68 which is energised by the drive pulses produced by the converter circuit 46 (FIG. 1). The drive pulses oscillate the valve member 66 so as to move it between a position in which the interior of the bellows 50 is connected to atmospheric pressure and a position in which the interior of the bellows is connected to the reduced pressure generated in the engine manifold. In a manner to be described in more detail below, the effect is, therefore, to contract the bellows 50 to an extent dependent on the mark/space ratio of the drive pulses, and the contraction of the bellows tensions the cable 56 and opens the engine throttle accordingly.

When the driver of the vehicle wishes to bring the system into operation so as to have the vehicle controlled to run at a predetermined speed, he accelerates the vehicle up to (or brakes the vehicle down to) the desired speed. The value of the signal $V_s$ produced by the pulse averager 26 will then be representative of the desired speed. The driver then momentarily closes switch 34, as by pressing a dashboard-mounted push-button, and this value of $V_s$ becomes stored in the memory 36. The system is now in operation, and the amplifier 42 compares the memory output $V_m$ with the instantaneous value of the signal $V_s'$, which will vary with vehicle speed.

If the vehicle speed should vary from the predetermined level represented by the memory output $V_m$, the value of the signal $V_s$ will change, and there will be change in relationship between $V_m$ and $V_s'$. The error signal $V_e$ will therefore change and the mark/space ratio of the drive pulses produced by the coverter 46 will alter. There will be a consequent alteration in the oscillations of the valve control member 66 (FIG. 2) in such a direction as to contract or expand the bellows 50 until the change in tension on the cable 56 has produced the necessary adjustment of the engine throttle to bring the vehicle back to the required speed.

The operation will now be desribed in more detail with reference to the waveform diagrams.

Figure 3A:
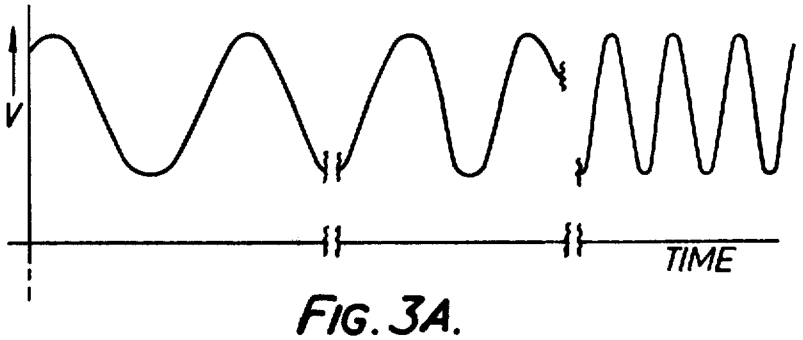
FIGS. 3A to 3C show waveforms occurring at the input end of the system.
Figure 3B:
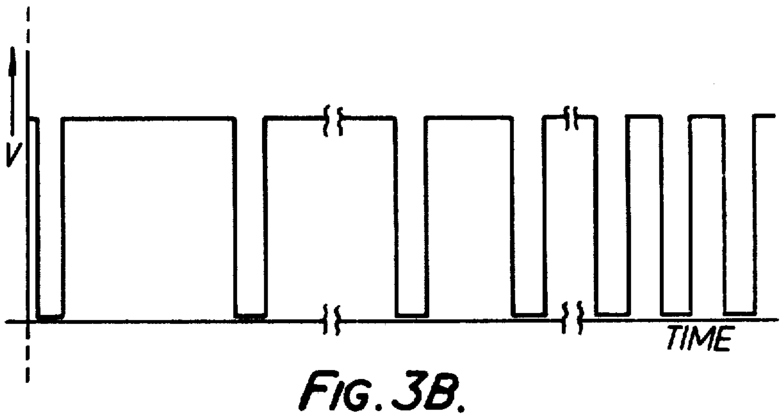
Figure 3C:
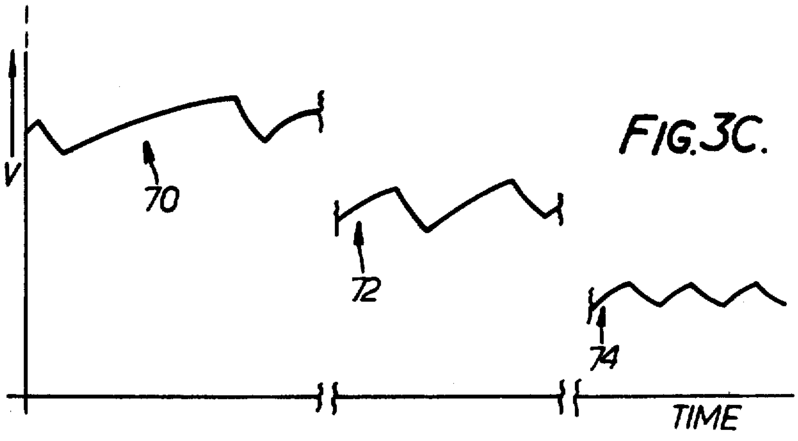

FIG. 3A shows the alternating waveforms produced on the line 20 by the speed transducer 18. FIG. 3B shows the pulses of corresponding frequency but of fixed amplitude and pulse width which are produced by the frequency to pulse converter 22. In the pulse averager circuit 26, the pulses are converted into a signal having a mean amplitude dependent on the mean level, and thus the frequency, of the pulses on the line 24. FIG. 3C shows representative waveforms of the output $V_s$ of the pulse averager 26. Waveform 70 shows $V_s$ corresponding to a low vehicle speed, waveform 72 shows $V_s$ at a medium vehicle speed, and waveform 74 shows $V_s$ at a high vehicle speed. It will be apparent that the pulse averager circuit 26 is arranged so that the level of $V_s$ is dependent on the frequency of the pulses of FIG. 3B and reduces as speed increases and therefore is dependent on vehicle speed. Also apparent from FIG. 3C is the fact that the pulse averager circuit 26 is arranged so that $V_s$ carries ripple at the input pulse frequency, and waveforms 70, 72 and 74 show how the ripple frequency accordingly increases with vehicle speed.

Figure 4A:
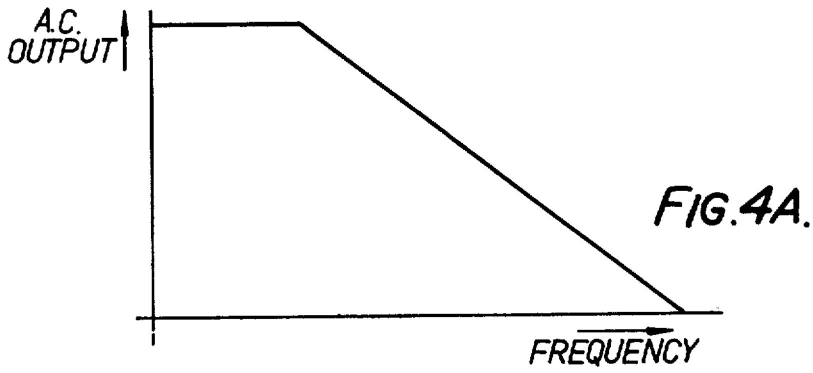
FIGS. 4A to 4C show output characteristics (output against frequency) arising in the system.

FIG. 4A is a characteristic showing how the pulse averager circuit 26 tends to attenuate the ripple as the ripple frequency increases, the attenuation in this example being of the order of 6 db per octave. The effect of this characteristic is shown in the waveforms 70, 72 and 74 of FIG. 3C where the amplitude of the ripple in the waveform 74 is substantially less than in the waveform 70.

The memory circuit 36 stores the mean amplitude of $V_s$ corresponding to the desired vehicle speed, and the memory output $V_m$ is therefore a substantially ripple-free signal. As will be explained in more detail below, however, $V_m$ is given an offset relative to the stored value of $V_s$, the offset being dependent on the stored value of $V_s$ so as to produce the necessary greater throttle opening at high vehicle speeds.

The output of the amplifier 42 is given by $$V_e = V_m + G(V_m - V_s') \qquad (1)$$

where G is the gain of the amplifier.

Therefore, when the vehicle speed corresponds substantially to the predetermined speed, $V_e$ will be equal to $V_m$ but will carry a ripple component corresponding to the ripple on the signal $V_s$ multiplied by the gain of the error amplifier 42.

Figure 4B:
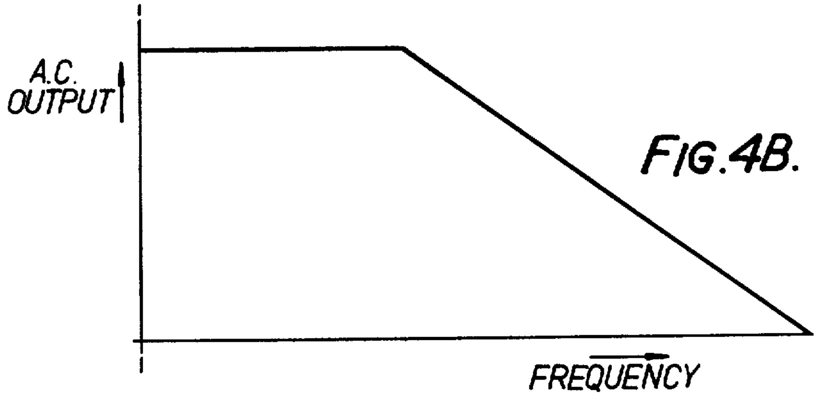
Figure 4C:
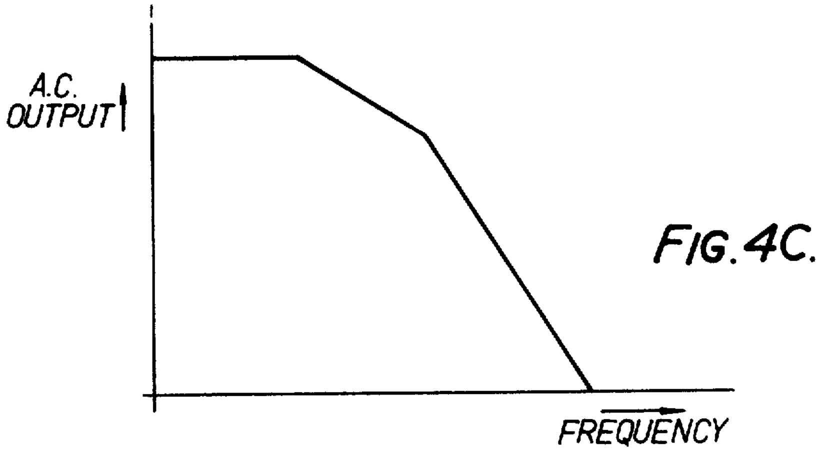

The gain characteristic of the error amplifier 42 is not constant, however. FIG. 4B shows how the gain of the amplifier falls off with increasing frequency, the gain falling off at a rate similar to that of the pulse averager 26 (6 db per octave, see FIG. 4A), though the point at which the gain commences to fall off occurs at a higher frequency. FIG. 4C shows the combined effect of the output characteristics of the pulse averager circuit 16 (FIG. 4A) and the error amplifier 42 (FIG. 4B). Over the range of frequencies corresponding to the normal range of vehicle speeds, the combined characteristic reduces the ripple at the rate of 12 db per octave with increasing input frequency.

Figure 5A:
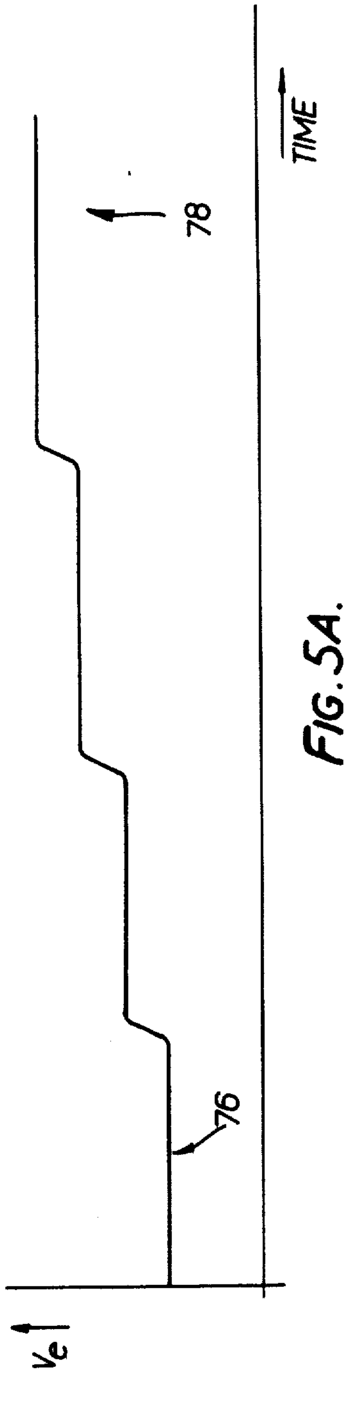
Figure 5B:
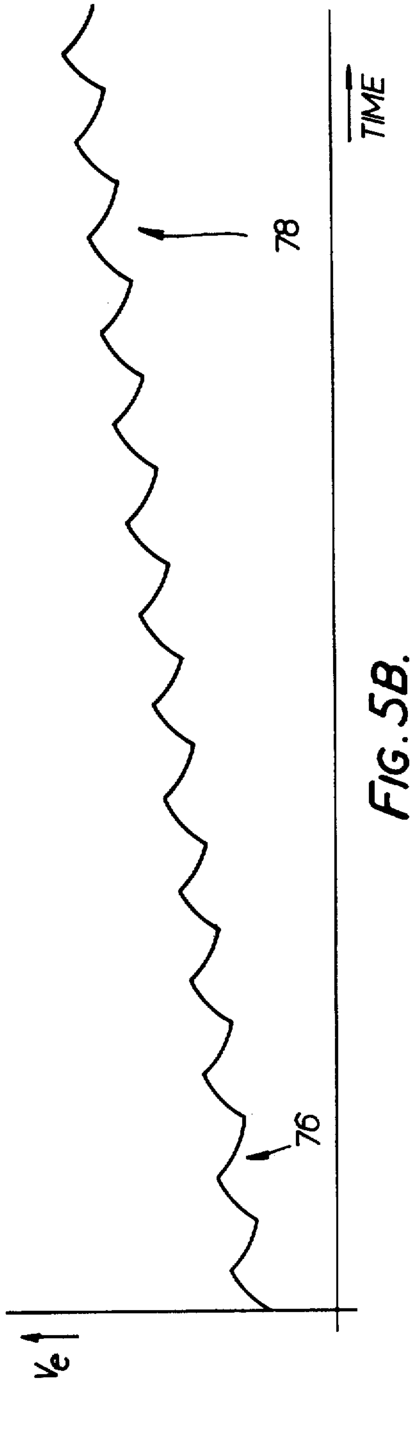

FIGS. 5A and 5B show waveforms of examples of the error signal. In FIG. 5A, the vehicle is assumed to be running at relatively high speed and the ripple is virtually completely attenuated, as evident from the characteristic of FIG. 4C. In FIG. 5B, the vehicle is assumed to be running at a relatively low speed and so carries substantial ripple. At 76, the vehicle is assumed to be running below the desired speed and at 78 the vehicle is assumed to be running above the desired speed.

Figures 6A, 6B:
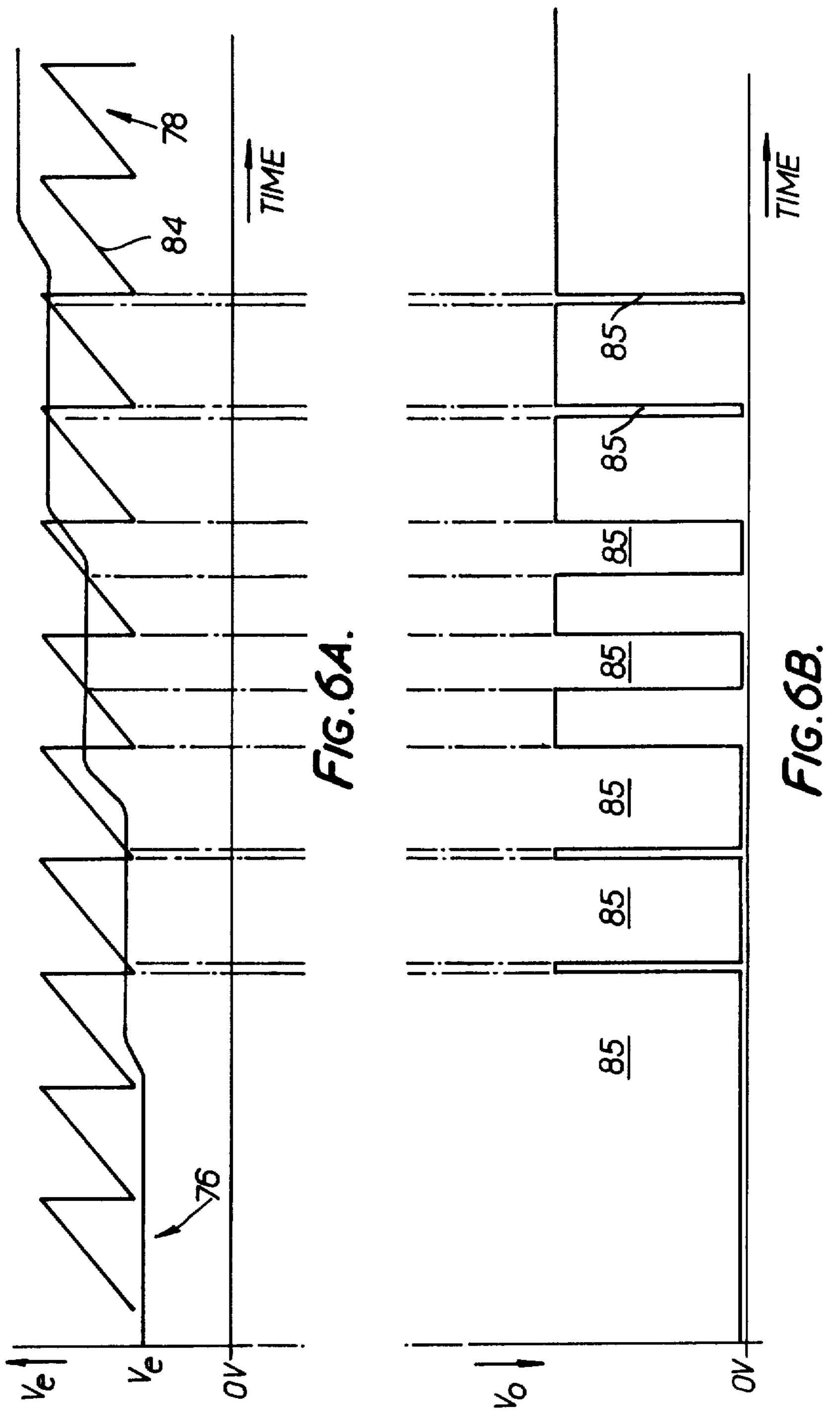
Figure 6C:
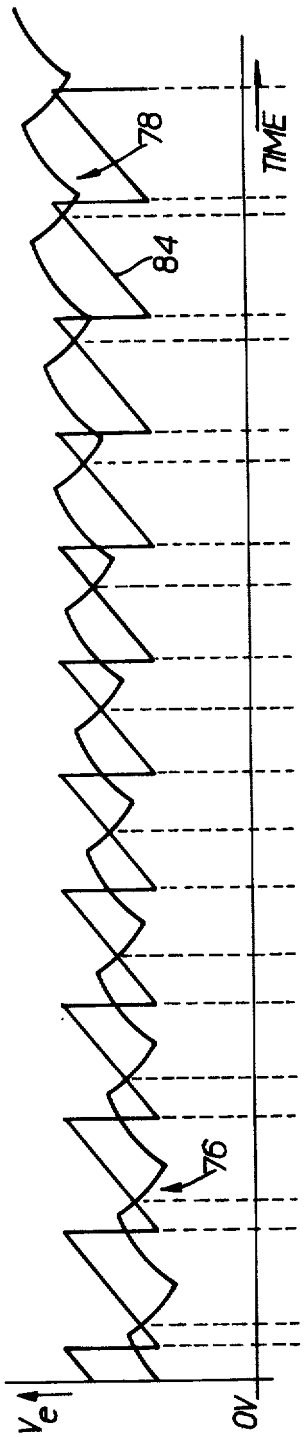

FIGS. 6A and 6C respectively repeat the error signals of FIGS. 5A and 5B and explain how the error signals produce the required correction in vehicle speed.

Within the converter 46 (FIG. 1), a ramp waveform 84 is generated having a constant mean amplitude and a constant frequency. In a manner to be explained in more detail below wth reference to the circuit diagram of FIG. 8, the converter 46 produces an output $V_o$ which goes positive (to a fixed and constant amplitude) as each ramp begins and falls to zero volts when the ramp exceeds the error signal. The error signals shown by way of example in FIGS. 6A and 6C therefore respectively produce the trains of negative-going drive pulses 85 shown in FIGS. 6B and 6D. These pulses have a constant frequency (fixed by the frequency of the ramp waveform 84) and a mark/space ratio which varies with the magnitude of the error signal $V_e$.

The negative-going pulses are applied to the solenoid coil 68 (FIG. 2) and oscillate the valve control member 66. The pulses are applied with such polarity to the solenoid 68 that each pulse lifts the valve member 66 to close off the port 62 and to open the port 64. At the end of the drive pulse, the valve member 66 reverses its position so as to close off the port 64 and to open port 62. The result is, therefore, that the greater the mark/space ratio of the pulses, the lower will be the mean pressure in the bellows 50 and the more the engine throttle will be opened. Because of the offset, referred to above, between $V_m$ and the stored value of $V_s$, the system will stabilise at a higher mean throttle opening at higher vehicle speeds.

Figure 6D:
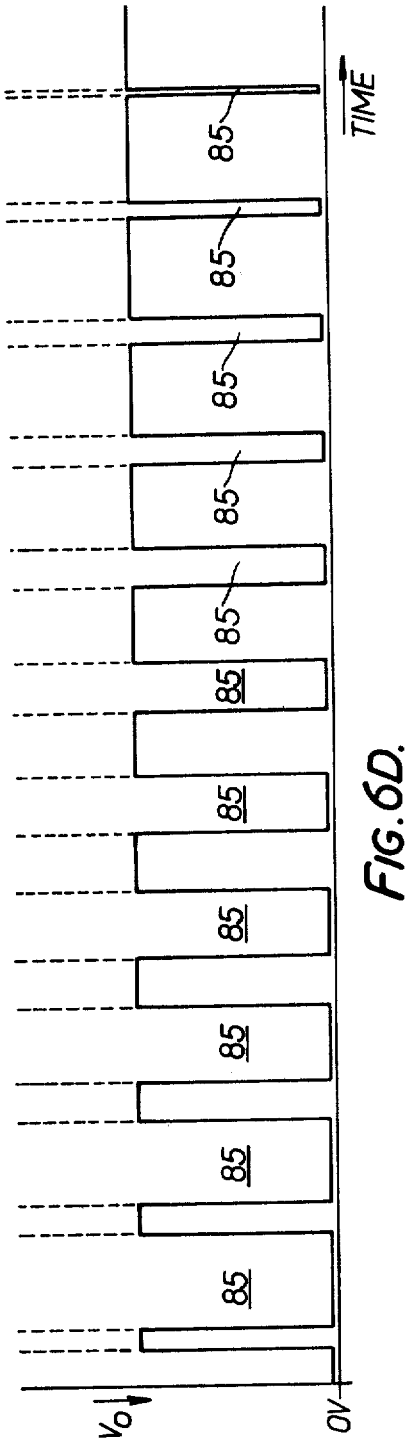

FIGS. 6B and 6D show that the effect of the combined output/frequency characteristic (FIG. 4C) of the pulse averager 26 and the error amplifier 42 (accentuating the ripple on the error signal $V_e$ at low vehicle speeds as compared with that at higher vehicle speeds) is to increase the range of control (proportional bandwidth) at low speeds as compared with high speeds. At low vehicle speeds (FIG. 6D), drive pulses are produced even when the average value of the error signal is below or above the trough of the ramp waveform 84. At higher speeds (FIG. 6B), the difference between the vehicle speed at which the throttle is completely closed and the vehicle speed at which it is completely open is much less. There is thus an increase in system gain at high vehicle speeds compared with the system gain at low vehicle speeds, and this tends to compensate for the fact that the available vehicle acceleration is greater at lower vehicle speeds than at higher vehicle speeds. This is particularly important in a case where the system is applied to a vehicle having an automatic transmission including a fluid torque converter. Below about 2000 r.p.m., the torque converter provides torque multiplication which can considerably increase the available rate of engine acceleration. The reduction in system gain at lower speeds ensures smooth control of the vehicle speed over this phase of the transmission. The higher gain at high speeds achieves accurate control at this end of the speed range.

FIG. 7 shows the gain/frequency characteristic of the filter 38. As shown, the filter has substantially unity gain at low frequencies, but the gain increases to a positive value A (about 2) at a frequency F of the order of 1 Hz, which is the frequency at which the system tends to hunt, and thereafter falls back to unity at higher frequencies.

The variable gain characteristic (FIG. 7) of the filter 38 serves to stabilise the control system by phase shifting changes in $V_s$ to damp any tendency for the system to hunt within the speed control range of the system in response to changing road conditions and engine throttle correction.

The circuits of various blocks in the block diagram of FIG. 1 will now be described in more detail with reference to FIG. 8, in which items corresponding to items in the other Figures are correspondingly referenced.

The circuit is supplied from the normal vehicle electrical supply lines 100 (V+) and 102 (0 volts). Line 100 is connected through a resistor 104 to a line 106 the voltage ($V_c$) on which is held substantially constant by means of a zener diode 108 shunted across a capacitor 110.

As shown, the pulse averager 26 comprises a capacitor 112 and a resistor 111, the capacitor 112 being connected to the line 104. When the system is switched on, capacitor 112 is initially in a discharged state and the voltage $V_s$ is therefore equal to $V_c$. As the input frequency increases, the mean level of $V_s$ decreases from $V_c$ down towards 0 volts.

The memory 36 comprises a capacitor 114 which is connected to be charged by the voltage $V_s$ through a resistor 116 and a field effect transistor 118 which constitutes the switch 34 of FIG. 1. Two offset adjusting resistors 115 and 117 are provided, which connect respective ends of resistor 116 to 0 volts. The gate of the field effect transistor 118 is connected to the 0 volt line 102 through resistors 120 and 122, and transistor 118 is momentarily rendered conductive (corresponding to closure of switch 34) by applying voltage $V_c$ to a control line 124. Capacitor 114 becomes charged to the mean level of the voltage $V_s$.

The stored voltage on capacitor 114 controls the conduction of a second field effect transistor 126 whose conduction path is connected between the lines 106 and 102 through resistors 128, 130, and 132 and the emitter-collector path of a control transistor 134. Transistor 134 has its base-emitter path connected across a zener diode 136 which is fed from the line 106 through a resistor 138. The effect is, therefore, that the transistor 134 maintains the current level through the field effect transistor 126 substantially constant. The constant current is selected to be at such a value that transistor 126 is held at a point on its operating characteristic where its conductivity is substantially unaffected by temperature change (over a normal ambient range).

The voltage $V_m$ is taken off by a line 140 and will of course therefore vary with the change stored on the capacitor 114. However, $V_m$ does not exactly follow the stored value of $V_s$ but is proportionately lower at lower values of $V_s$ to give the required offset referred to above. This is obtained by the inherent change in gain across the source-follower connected FET 126. The effect is trimmed by the resistors 116 and 117.

Resistor 115, in conjunction with resistor 111, sets the starting d.c. level of the memory.

The filter 38 comprises an operational amplifier 150 whose positive input is connected to receive the signal $V_s$. Its negative input is connected to the 0 volt line 102 through a capacitor 152 and a resistor 154, and these, in combination with a capacitor 156 and a resistor 158 connected in a feedback loop, serve to give the filter the desired characteristic (see FIG. 7). The output of the amplifier 150 provides the voltage $V_s'$ on a line 160.

The error amplifier 42 comprises an operational amplifier 170 which is connected to receive the signals $V_m$ and $V_s'$ through resistors 172 and 174 respectively. A feedback loop comprising a resistor 176 and a capacitor 178 gives the amplifier the desired characteristic (see FIG. 4B).

The error signal $V_e$ is then fed into the voltage to drive pulse converter 46 through a resistor 180. The converter 46 comprises an operational amplifier 182 to one input of which is fed the signal $V_e$ and to the other input of which is fed the ramp waveform 84 (see FIGS. 6A and 6C) from an oscillator 184.

The drive pulses from the amplifier 182 are level-shifted by a zener diode 186 which is connected to the base of the output transistor 192 through a resistor 188 and to the 0 volt line 102 through a resistor 190. The output transistor 192 is connected across the supply lines 100 and 102 in series with the throttle actuator solenoid 68 (see FIG. 2).

It will be appreciated that $V_m$ and $V_s'$ will be affected in the same direction by variations in the supply voltage $V_c$, and the effect on $V_e$ is therefore minimal.

The system is provided with means for overriding its operation should the driver make use of the brake or throttle. Any such use is arranged to connect a line 194 to 0 volts through a latching circuit (not shown). This prevent conduction of transistor 192 and thus blocks the application of drive pulses to the throttle solenoid 68. When the driver wishes to bring the system back into operation, he operates a switch or button (not shown) which releases the latch circuit and open-circuits the line 194.

Diode 196 clips the voltage spikes generated as solenoid 68 switches off, thereby protecting transistor 192.

As shown in FIG. 1, an adjustable potential divider 200 may be provided, by means of which the driver can set up a particular value $V_m$, corresponding to a desired vehicle speed. This is an alternative to setting up the speed reference by running the vehicle at the desired speed and feeding the corresponding signal $V_s$ into the memory 36.

As an alternative to the speed sensitive transducer 18, the vehicle speed may be sensed by deriving pulses from the ignition circuit of the engine 10 via a switch 202 (FIG. 1). This is particularly applicable, of course, where the engine is of the spark-ignition type and the vehicle transmission is such that there is a fixed relationship between engine and vehicle speed. Normally the system would only be operative in the highest gear. It will be appreciated that the system in this mode is thus being used for controlling the vehicle speed direct. However, such an engine-speed triggered system may also be used in vehicles with fluid connection between engine and road wheels if the characteristic of the filter 38 is modified, usually by increasing the frequency at which the filter peaks and also by increasing the peak amplitude. This modification to the filter characteristic compensates for the fact that there is no longer a direct connection between engine and road speed.

In a further modification, the system can be used merely to limit vehicle speed to a desired maximum—instead of controlling it at a predetermined speed. In such a modification, the error signal $V_e$ which would be produced when the actual speed exceeded the preset maximum would be arranged to move the throttle towards the closed position until the speed was brought down below the maximum.

If desired, the voltage to drive pulse converter 46 can be modified so that the drive pulses have a variable instead of a constant frequency. This can be achieved by varying the frequency of the ramp waveform 84 (FIGS. 5C and 5E), for example under control of the magnitude of the signal $V_e$. Such a modification would enable the control action to be adjusted to suit particular requirements.

If desired, the pulse averager circuit 26 may be modified so that the ripple frequency is not equal to the pulse frequency but is related to it in some other way, e.g. a multiple of it.

The throttle actuator shown in FIG. 2 is merely one example of a suitable type. Any other suitable type of throttle actuator may be used instead, however. For example, an actuator operating by means of above-atmospheric pressure (instead of sub-atmospheric pressure as illustrated in FIG. 2) or on hydraulic pressure may be used. A further possibility is to use an electric motor. Depending on the type of actuator, the error signal $V_e$ can be fed directly to it instead of first being converted into drive pulses.

What is claimed is:

1. A storage circuit for storing an electrical signal, comprising an electronic switch, a capacitor connected to be charged by the electrical signal through the electronic switch, the switch being capable of assuming a high impedance state to minimise subsequent discharge of the capacitor, a pair of voltage supply lines, a field effect transistor having an input circuit connected to receive the charge on the capacitor and having an output circuit, a variable impedance device, the output circuit of the field effect transistor being connected across the voltage supply lines in series with the variable impedance device, means responsive to the voltage across the voltage supply lines for controlling the variable impedance device so that the current in the output circuit of the field effect transistor is substantially constant at a predetermined value, and means connected to the output circuit of the field effect transistor to derive an output signal of the storage circuit in dependence on the charge on the capacitor, the said predetermined value of the current being the current value at which the variation of the conductivity of the field effect transistor with temperature is substantially a minimum.

2. A storage circuit according to claim 1, in which the electronic switch is a further field effect transistor.

3. A circuit according to claim 1, in which the gain of the field effect transistor is such that the relationship between the output signal and the charge on the capacitor varies with the charge on the capacitor.

* * * * *